United States Patent
Son et al.

(10) Patent No.: US 10,028,381 B2
(45) Date of Patent: Jul. 17, 2018

(54) COMPOSITE ELECTRONIC COMPONENT AND BOARD HAVING THE SAME

(71) Applicant: SAMSUNG ELECTRO-MECHANICS CO., LTD., Suwon-si, Gyeonggi-do (KR)

(72) Inventors: Soo Hwan Son, Suwon-si (KR); Young Ghyu Ahn, Suwon-si (KR); Yu Jin Choi, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 22 days.

(21) Appl. No.: 15/069,438

(22) Filed: Mar. 14, 2016

(65) Prior Publication Data

US 2017/0018373 A1    Jan. 19, 2017

(30) Foreign Application Priority Data

Jul. 17, 2015   (KR) .................. 10-2015-0101906

(51) Int. Cl.
*H05K 1/11*     (2006.01)
*H05K 1/18*     (2006.01)
(Continued)

(52) U.S. Cl.
CPC .............. *H05K 1/111* (2013.01); *H01G 2/06* (2013.01); *H01G 4/30* (2013.01); *H01G 4/38* (2013.01);
(Continued)

(58) Field of Classification Search
CPC .................. H05K 1/111; H05K 1/181; H05K 2201/10015; H01G 4/012; H01G 4/0085; H01G 4/12; H01G 4/30; H01G 4/38; H01G 4/1127; H01G 2/06; H01G 9/15; H01G 9/042042

See application file for complete search history.

(56) References Cited

U.S. PATENT DOCUMENTS

| | | | |
|---|---|---|---|
| 7,920,370 B2* | 4/2011 | Lee ................ | H01G 4/012 361/306.3 |
| 8,540,783 B2* | 9/2013 | Ibata .............. | H01G 9/012 29/25.03 |

(Continued)

FOREIGN PATENT DOCUMENTS

| JP | 09-326334 A | 12/1997 |
|---|---|---|
| JP | 10-289837 A | 10/1998 |

(Continued)

*Primary Examiner* — Hoa C Nguyen
(74) *Attorney, Agent, or Firm* — McDermott Will & Emery LLP

(57) ABSTRACT

A composite electronic component includes a multilayer ceramic capacitor including a ceramic body in which dielectric layers and internal electrodes are alternately disposed, and first and second external electrodes disposed on a lower surface of the ceramic body; a tantalum capacitor including a body portion containing a sintered material of a tantalum powder and a tantalum wire having a portion embedded in the body portion, and disposed on the multilayer ceramic capacitor; and an encapsulant part enclosing the tantalum capacitor and the multilayer ceramic capacitor, wherein the internal electrodes are led to the lower surface of the ceramic body.

19 Claims, 7 Drawing Sheets

(51) Int. Cl.
*H01G 4/30* (2006.01)
*H01G 4/38* (2006.01)
*H01G 2/06* (2006.01)
H01G 9/15 (2006.01)
H01G 9/042 (2006.01)
H01G 4/012 (2006.01)
H01G 4/12 (2006.01)
H01G 4/008 (2006.01)

(52) U.S. Cl.
CPC ........... *H05K 1/181* (2013.01); *H01G 4/0085* (2013.01); *H01G 4/012* (2013.01); *H01G 4/12* (2013.01); *H01G 4/1227* (2013.01); *H01G 9/042* (2013.01); *H01G 9/15* (2013.01); *H05K 2201/10015* (2013.01)

(56) References Cited

U.S. PATENT DOCUMENTS

| | | |
|---|---|---|
| 2007/0211414 A1* | 9/2007 | Pelcak .................. H01G 9/012 361/541 |
| 2010/0033904 A1 | 2/2010 | Niki |
| 2014/0153155 A1* | 6/2014 | Fujii ..................... H01G 4/302 361/301.4 |
| 2015/0036265 A1 | 2/2015 | Shin et al. |

FOREIGN PATENT DOCUMENTS

| KR | 10-2015-0016699 A | 2/2015 |
|---|---|---|
| WO | 2008-044483 A1 | 4/2008 |

* cited by examiner

COMPOSITE ELECTRONIC COMPONENT AND BOARD HAVING THE SAME

CROSS-REFERENCE TO RELATED APPLICATIONS

This application claims the benefit of priority to Korean Patent Application No. 10-2015-0101906, filed on Jul. 17, 2015 with the Korean Intellectual Property Office, the entirety of which is incorporated herein by reference.

TECHNICAL FIELD

The present disclosure relates to a composite electronic component including a plurality of passive elements, and a board having the same.

BACKGROUND

Multilayer ceramic capacitors, a type of multilayer chip electronic component, may have a structure in which a plurality of dielectric layers and internal electrodes interposed between the dielectric layers and having different polarities are alternately stacked.

Multilayer ceramic capacitors may have characteristics in which levels of equivalent series resistance (ESR) and equivalent series inductance (ESL) are low, but have unfavorable DC-bias properties relative to tantalum capacitors and are infeasible in implementing high capacitance.

In addition, acoustic noise may occur when the multilayer ceramic capacitors are directly mounted on a board.

On the other hand, tantalum capacitors may implement high capacitance and have superior DC-bias properties, but have limitations, including a high degree of ESR.

SUMMARY

An aspect of the present inventive concept provides a composite electronic component including a complex body including a multilayer ceramic capacitor and a tantalum capacitor, internal electrodes of the multilayer ceramic capacitor being led to a lower portion of a ceramic body to thereby allow for a decrease in size of a current loop formed within the multilayer ceramic capacitor and a reduction in equivalent series inductance (ESL).

Another aspect of the present inventive concept provides a board having a composite electronic component, including a printed circuit board having an electrode pad formed thereon, the composite electronic component installed on the printed circuit board, and a soldering portion connecting the electrode pad and the composite electronic component to each other.

BRIEF DESCRIPTION OF DRAWINGS

The above and other aspects, features, and advantages of the present inventive concept will be more clearly understood from the following detailed description taken in conjunction with the accompanying drawings, in which.

DETAILED DESCRIPTION

Figure 1:
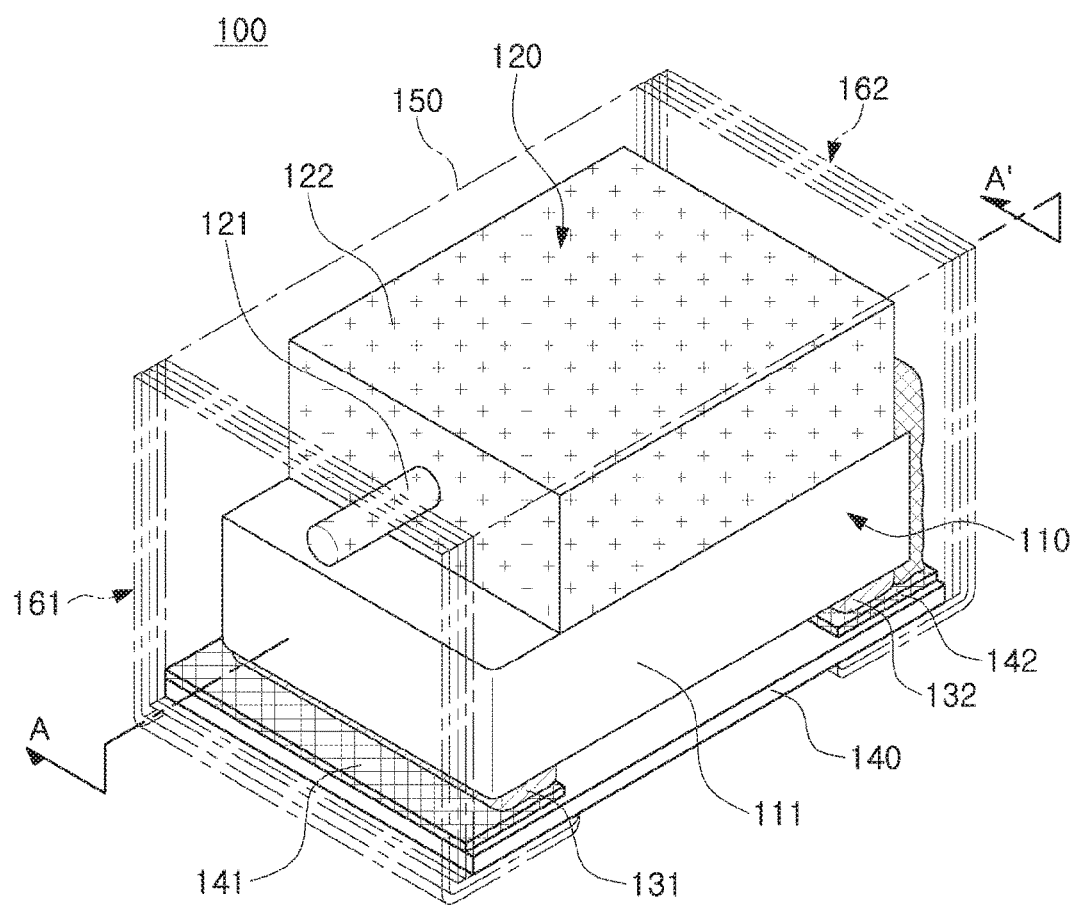
FIG. 1 is a perspective view of a composite electronic component according to an exemplary embodiment of the present inventive concept, in which terminal electrodes and an encapsulant part are projected.

Hereinafter, embodiments of the present inventive concept will be described as follows with reference to the attached drawings.

The present inventive concept may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no other elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" relative to other elements would then be oriented "below," or "lower" relative to the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein is for describing particular embodiments only and is not intended to be limiting of the present inventive concept. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present inventive concept will be described with reference to schematic views illustrating embodiments of the present inventive concept. In the drawings, for example, due to manufacturing techniques and/or tolerances, modifications of the shape shown may be estimated. Thus, embodiments of the present inventive concept should not be construed as being limited to the particular shapes of regions shown herein, for example, to include a change in shape results in manufacturing. The following embodiments may also be constituted by one or a combination thereof.

The contents of the present inventive concept described below may have a variety of configurations and propose only a required configuration herein, but are not limited thereto.

Directions of a hexahedron will be defined in order to clearly describe exemplary embodiments of the present inventive concept. L, W, and T shown in the drawings refer to a length direction, a width direction, and a thickness direction, respectively.

Composite Electronic Component

Hereinafter, exemplary embodiments will be described with reference to the attached drawings.

FIG. 1 is a perspective view of a composite electronic component according to an exemplary embodiment, in which terminal electrodes and an encapsulant part are projected.

Referring to FIG. 1, a composite electronic component 100 according to an exemplary embodiment may include an insulating sheet 140, a multilayer ceramic capacitor 110, a tantalum capacitor 120, an encapsulant part 150, and terminal electrodes 161 and 162.

The multilayer ceramic capacitor 110 may be disposed on the insulating sheet 140, and the tantalum capacitor 120 may be disposed on the multilayer ceramic capacitor 110.

The terminal electrodes 161 and 162 may include an anode terminal 161 and a cathode terminal 162.

According to an exemplary embodiment, where the composite electronic component includes the multilayer ceramic capacitor 110 and the tantalum capacitor 120, acoustic noise may be significantly reduced, high capacitance may be implemented, levels of equivalent series resistance (ESR) and equivalent series inductance (ESL) may be low, and improved DC-bias properties may be provided.

A tantalum capacitor may implement high capacitance and superior DC-bias properties, but may have limitations, such as a high degree of equivalent series resistance (ESR).

A multilayer ceramic capacitor may exhibit low levels of equivalent series resistance (ESR) and equivalent series inductance (ESL), but may have unfavorable DC-bias properties relative to the tantalum capacitor and may be infeasible in implementing high capacitance.

In addition, acoustic noise may occur when the multilayer ceramic capacitor is directly mounted on a board.

The composite electronic component 100 according to an exemplary embodiment, however, may include both the multilayer ceramic capacitor 110 and the tantalum capacitor 120 to reduce a high level of equivalent series resistance (ESR), the disadvantage of the tantalum capacitor.

In addition, deterioration in DC-bias properties, one disadvantage of the multilayer ceramic capacitor, may be improved.

Furthermore, according to an exemplary embodiment, the multilayer ceramic capacitor may be disposed on an insulating sheet, whereby acoustic noise may be significantly reduced.

Figure 2:
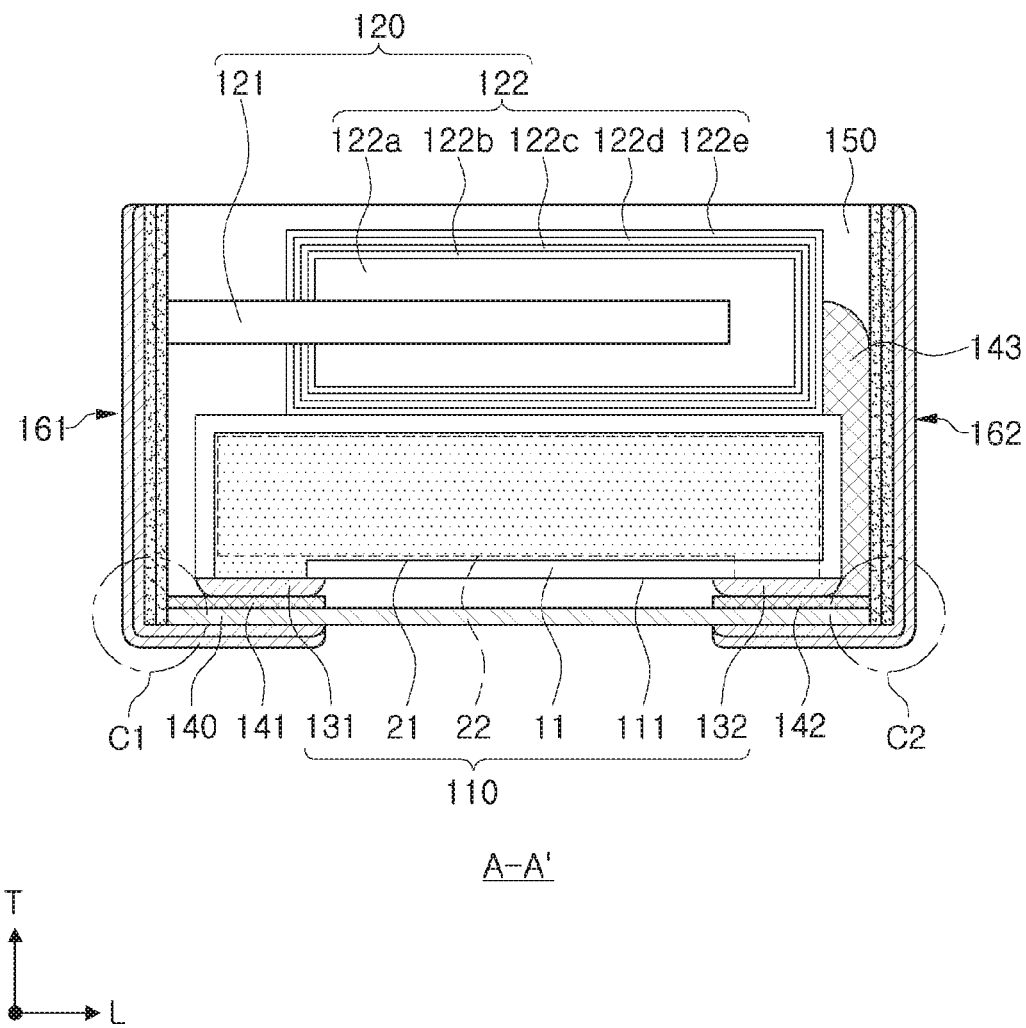
FIG. 2 is a cross-sectional view of FIG. 1, taken along line A-A'.

FIG. 2 is a cross-sectional view of FIG. 1, taken along line A-A'.

As illustrated in FIGS. 1 and 2, according to an exemplary embodiment, the multilayer ceramic capacitor 110 may include a ceramic body 111 in which dielectric layers 11 and internal electrodes 21 and 22 are alternately disposed, and external electrodes 131 and 132 formed on an external surface of the ceramic body to be connected to the internal electrodes 21 and 22.

The ceramic body 111 may have a substantially hexahedral shape including upper and lower surfaces facing each other in the thickness direction, first and second end surfaces facing each other in the length direction, and first and second side surfaces facing each other.

In an exemplary embodiment, the upper and lower surfaces may be mounting surfaces adjacent to and facing the insulating sheet 140 when the multilayer ceramic capacitor is disposed on the insulating sheet 140. After the multilayer ceramic capacitor is disposed on the insulating sheet 140, the mounting surface adjacent to and facing the insulating sheet 140 may be the lower surface and a surface opposite the lower surface may be the upper surface.

Figure 3:
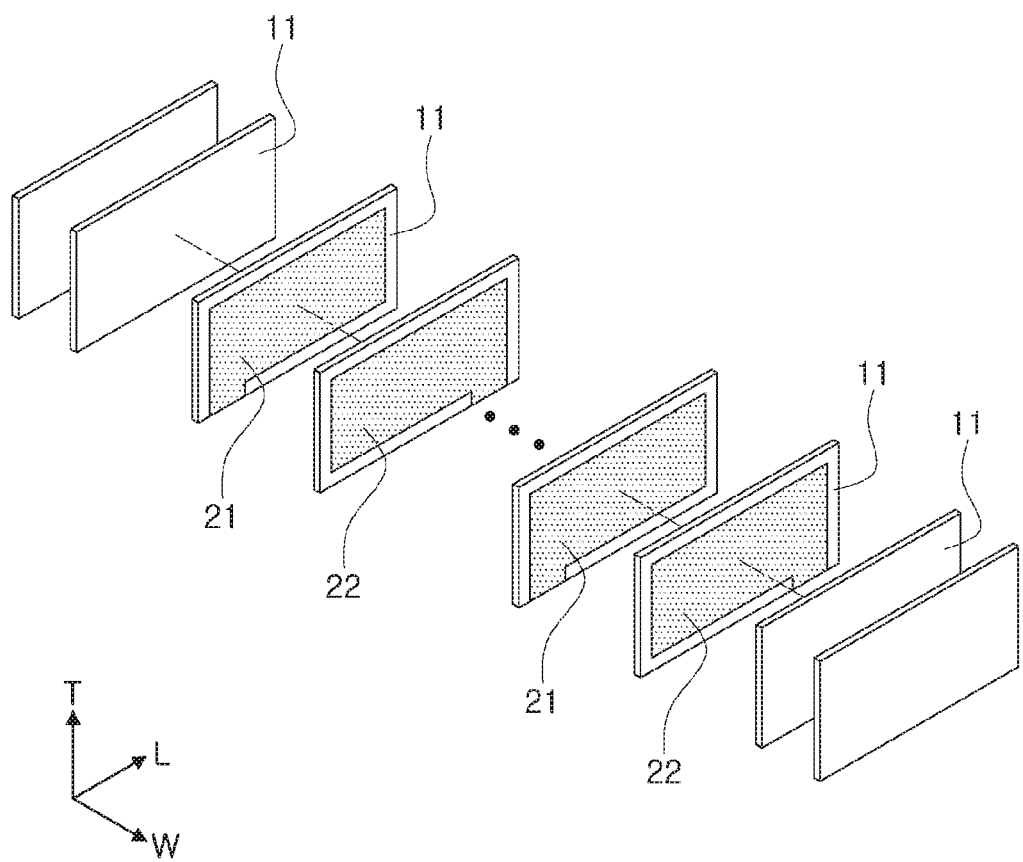
FIG. 3 is an exploded perspective view of a ceramic body of a multilayer ceramic capacitor according to an exemplary embodiment.

FIG. 3 is an exploded perspective view of the ceramic body 111 of the multilayer ceramic capacitor 110 according to an exemplary embodiment.

Referring to FIG. 3, the internal electrodes may include first internal electrodes 21 and second internal electrodes 22, and the first and second internal electrodes may be alternately disposed on each of the dielectric layers 11 while having the dielectric layer 11 interposed therebetween.

The ceramic body 111 may be formed by stacking the plurality of dielectric layers and internal electrodes and then sintering the same.

The dielectric layers 11 may contain a ceramic powder having high permittivity, such as a barium titanate ($BaTiO_3$) based powder or a strontium titanate ($SrTiO_3$) based powder, but the present inventive concept is not limited thereto.

A material for forming the first and second internal electrodes 21 and 22 is not particularly limited. For example, the first and second internal electrodes 21 and 22 may be formed using a conductive paste formed of at least one of a noble metal material such as palladium (Pd), a palladium-silver (Pd—Ag) alloy, or the like, nickel (Ni), and copper (Cu).

The first and second internal electrodes may include lead portions led to a lower surface of the ceramic body 111, and may be disposed perpendicularly with respect to the lower surface of the ceramic body 111.

Referring to FIG. 2 again, the external electrodes 131 and 132 may be disposed on the lower surface of the ceramic body 111 to be electrically connected to the internal electrodes. The external electrodes 131 and 132 may include a first external electrode 131 and a second external electrode 132. The first external electrode 131 may be connected to the lead portions of the first internal electrodes 21 led to the lower surface of the ceramic body and may be electrically connected to the first internal electrodes 21, and the second external electrode 132 may be connected to the lead portions of the second internal electrodes 22 led to the lower surface of the ceramic body and may be electrically connected to the second internal electrodes 22. Unlike a general multilayer ceramic capacitor, a nickel/tin (Ni/Sn) plating layer may not be disposed on the first and second external electrodes 131 and 132 according to an exemplary embodiment.

As described later, since the composite electronic component includes the encapsulant part 150 enclosing the multilayer ceramic capacitor 110 disposed on an upper surface of the insulating sheet 140 and the tantalum capacitor 120 disposed on the multilayer ceramic capacitor, it is unnecessary to form a plating layer on the first and second external electrodes 131 and 132 of the multilayer ceramic capacitor 110.

Therefore, deterioration in reliability due to the infiltration of a plating solution into the ceramic body 111 of the multilayer ceramic capacitor 110 may be prevented.

As illustrated in FIG. 2, according to an exemplary embodiment, the tantalum capacitor 120 may include a body portion 122 and a tantalum wire 121, and the tantalum wire 121 may be embedded in the body portion 122 in such a manner that a portion thereof is exposed through one surface of the body portion 122 in the length direction.

The body portion 122 of the tantalum capacitor 120 may include an anode body 122a, a dielectric layer 122b, a solid electrolytic layer 122c, a carbon layer 122d, and a cathode layer 122e, but is not limited thereto.

The anode body 122a may be formed of a porous sintered material containing a tantalum powder.

The dielectric layer 122b may be formed on a surface of the anode body 122a. The dielectric layer 122b may be formed by oxidizing the surface of the anode body 122a. For example, the dielectric layer 122b may be formed of a dielectric material containing tantalum oxide ($Ta_2O_5$), which is an oxide of tantalum forming the anode body, and may be formed at a predetermined thickness on the surface of the anode body 122a.

The solid electrolytic layer 122c may be formed on a surface of the dielectric layer 122b. The solid electrolytic layer 122c may contain one or more of a conductive polymer and manganese dioxide ($MnO_2$).

When the solid electrolytic layer 122c is formed of the conductive polymer, it may be formed on the surface of the dielectric layer 122b by a chemical polymerization method or an electrolytic polymerization method. The conductive polymer material is not particularly limited as long as it is a polymer material having conductivity, and examples thereof may include polypyrrole, polythiophene, polyaniline, and the like.

When the solid electrolytic layer 122c is formed of manganese dioxide ($MnO_2$), the anode body having the dielectric layer formed on the surface thereof may be immersed in an aqueous manganese solution such as nitric acid manganese, and subsequently, the aqueous manganese solution may be decomposed by applying heat thereto to form a conductive manganese dioxide on the surface of the dielectric layer.

The carbon layer 122d containing carbon may be disposed on the solid electrolytic layer 122c.

The carbon layer 122d may be formed of a carbon paste, and may be formed by applying the carbon paste dispersed in water or an organic solvent in a state in which a conductive carbon material powder such as natural graphite, carbon black, or the like, is mixed with a binder, a dispersing agent, or the like, onto the solid electrolytic layer 122c.

The cathode layer 122e containing a conductive metal may be disposed on the carbon layer 122d in order to increase electrical connectivity with the cathode terminal, and the conductive metal of the cathode layer 122e may be silver (Ag).

The tantalum capacitor 120 is not particularly limited, but may be connected to external terminals in a structure having no internal lead frame.

According to an exemplary embodiment, the multilayer ceramic capacitor 110 and the tantalum capacitor 120 may be stacked on each other in a direction perpendicular to a mounting direction, and may be connected in parallel with each other.

According to an exemplary embodiment, the multilayer ceramic capacitor 110 may be disposed on the insulating sheet 140 as illustrated in FIG. 2.

A material of the insulating sheet 140 is not particularly limited, as long as it exhibits insulating properties, and the insulating sheet 140 may be fabricated by using an insulating material such as a ceramic material or the like.

The encapsulant part 150 may be formed to cover the multilayer ceramic capacitor 110 and the tantalum capacitor 120, and an upper surface of the insulating sheet 140 on which the multilayer ceramic capacitor 110 and the tantalum capacitor 120 are disposed.

The encapsulant part 150 may serve to protect the multilayer ceramic capacitor 110 and the tantalum capacitor 120 from external environments, and may be mainly configured of epoxy, silica-based EMC, or the like, but the present inventive concept is not limited thereto.

Due to the encapsulant part 150, the composite electronic component according to an exemplary embodiment may be implemented as a single component in which the multilayer ceramic capacitor 110 and the tantalum capacitor 120 are combined with each other.

According to an exemplary embodiment, the tantalum capacitor 120 may be disposed to be in contact with the multilayer ceramic capacitor 110.

For example, an upper surface of the ceramic body 111 of the multilayer ceramic capacitor 110 and the body portion 122 of the tantalum capacitor 120 may be disposed to be indirect contact with each other.

According to an exemplary embodiment, external electrodes may not be disposed on the upper surface of the ceramic body 111, and may be disposed on the lower surface of the ceramic body 111, whereby electrical shorts between respective elements disposed within the composite electronic component may be prevented even in a case in which the tantalum capacitor 120 is disposed on the upper surface of the multilayer ceramic capacitor 110.

Therefore, it is unnecessary to form a separate insulating layer for insulating the multilayer ceramic capacitor 110 and the tantalum capacitor 120 from each other, whereby the volume of the multilayer ceramic capacitor or the tantalum capacitor may be advantageously increased by an amount equal to a thickness of the insulating layer.

As in an exemplary embodiment of the present inventive concept, when the internal electrodes 21 and 22 of the multilayer ceramic capacitor are exposed to the lower surface of the ceramic body 111 and have a current applied thereto through the external electrodes 131 and 132 disposed on the lower surface of the ceramic body 111, a size of a current loop formed within the multilayer ceramic capacitor may be decreased to allow for a reduction in equivalent series inductance (ESL), whereby ESL of the composite electronic component may be decreased.

In particular, in an exemplary embodiment, the multilayer ceramic capacitor having a structure in which ESL is reduced may be disposed in a lower portion of the composite electronic component while the tantalum capacitor having relatively high ESL may be disposed in an upper portion of the composite electronic component, whereby the ESL of the composite electronic component may be further decreased.

As illustrated in FIG. 2, according to an exemplary embodiment, the composite electronic component 100 may include the anode terminal 161 and the cathode terminal 162 electrically connected to the multilayer ceramic capacitor 110 and the tantalum capacitor 120.

According to an exemplary embodiment, the tantalum wire 121 and the first external electrode 131 of the multilayer ceramic capacitor 110 may be electrically connected to the anode terminal 161, and the body portion 122 of the tantalum capacitor 120 and the second external electrode 132 of the multilayer ceramic capacitor 110 may be electrically connected to the cathode terminal 162.

The tantalum wire 121 may be exposed to a first surface of the encapsulant part 150 in the length direction and may be connected to the anode terminal 161.

In the tantalum capacitor 120, a tantalum capacitor having a structure including no internal lead frame, maximum capacity as compared to an existing structure may be implemented, since the tantalum wire 121 may be exposed to the first surface of the encapsulant part 150 in the length direction.

As illustrated in FIG. 2, connection conductor portions 141 and 142 may be disposed on one or more of upper and lower surfaces of the insulating sheet 140.

Shapes of the connection conductor portions 141 and 142 are not particularly limited, as long as the connection conductor portions 141 and 142 contain a conductive material to electrically connect the anode and cathode terminals 161 and 162 formed on exterior portions of the encapsulant part and the multilayer ceramic capacitor 110 and the tantalum capacitor 120 disposed inside the encapsulant part.

According to an exemplary embodiment, the multilayer ceramic capacitor 110 and the tantalum capacitor 120 may be connected to the anode terminal 161 or the cathode terminal 162 by the connection conductor portions 141 and 142 disposed within the encapsulant part.

Hereinafter, a method of connecting the multilayer ceramic capacitor 110 and the tantalum capacitor 120 to the anode terminal 161 or the cathode terminal 162 will be described, but the present inventive concept is not limited thereto.

The first external electrode 131 of the multilayer ceramic capacitor 110 may be connected to the anode terminal 161 through a first connection conductor portion 141, and the second external electrode 132 of the multilayer ceramic capacitor 110 may be connected to the cathode terminal 162 through a second connection conductor portion 142.

The body portion 122 of the tantalum capacitor 120 may be connected to the cathode terminal 162 through a third connection conductor portion 143.

As illustrated in FIG. 2, the first and second connection conductor portions 141 and 142 may be in a form of metal pads, but are not limited thereto.

In addition, the metal pads may contain copper (Cu), but are not limited thereto.

The metal pads may include a first metal pad forming the first connection conductor portion 141 connected to the first external electrode 131 to be exposed to one surface of the encapsulant part 150, and a second metal pad forming the second connection conductor portion 142 connected to the body portion 122 and the second external electrode 132 to be exposed to the other surface of the encapsulant part 150.

The third connection conductor portion 143 may be a conductive resin portion formed by hardening a conductive resin paste. A shape of the third connection conductor portion 143 is not particularly limited, as long as the third connection conductor portion 143 may connect the body portion 122 of the tantalum capacitor 120 and the cathode terminal 162 to each other. As illustrated in FIG. 2, the third connection conductor portion 143 may also be connected to the second connection conductor portion 142.

The conductive resin portion may contain conductive particles and a base resin.

The conductive particles are not limited to, but may be, silver (Ag) particles, and the base resin may be a thermosetting resin, such as an epoxy resin.

In addition, the conductive resin portion may contain copper (Cu) as a conductive metal, but is not limited thereto.

Figure 4:
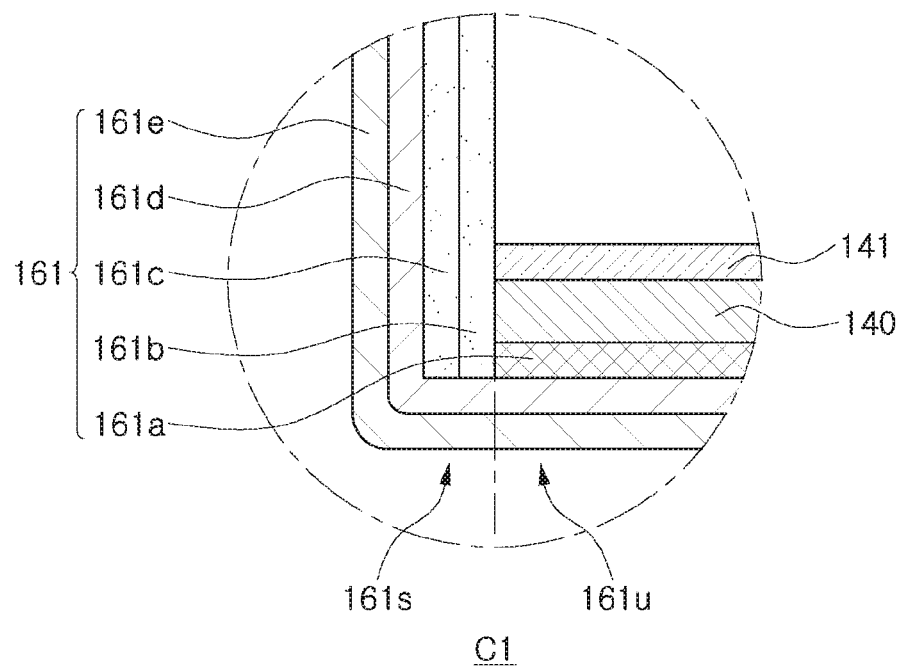
FIG. 4 contains enlarged views of region C1 and region C2 of FIG. 2.
Figure 4:
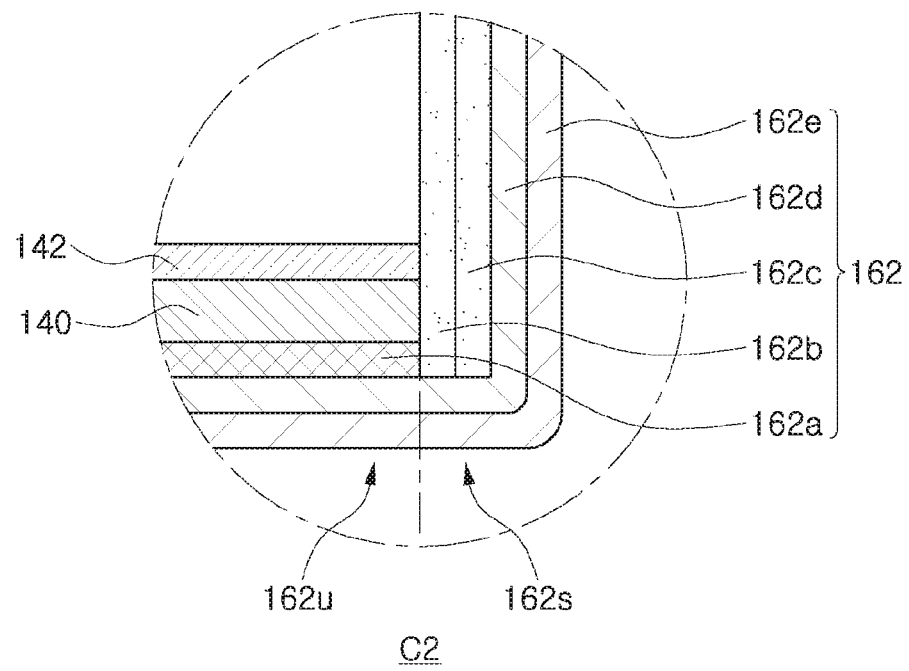

FIG. 4 contains enlarged views of region C1 and region C2 of FIG. 2.

Referring to FIG. 2 and FIG. 4, the terminal electrodes may include the anode terminal 161 and the cathode terminal 162.

The anode terminal 161 may be disposed on the first surface of the encapsulant part 150 in the length direction and the lower surface of the insulating sheet 140, and may be connected to the tantalum wire 121 and the first external electrode 131.

The cathode terminal 162 may be disposed on a second surface of the encapsulant part 150 in the length direction and the lower surface of the insulating sheet 140, and may be connected to the body portion 122 and the second external electrode 132.

According to an exemplary embodiment, the anode terminal 161 may be extended from the first surface of the encapsulant part 150 in the length direction to a portion of the lower surface of the insulating sheet 140, and the cathode terminal 162 may be extended from the second surface of the encapsulant part 150 in the length direction to another portion of the lower surface of the insulating sheet 140. The anode terminal 161 and the cathode terminal 162 may be formed to be spaced apart from each other on the lower surface of the insulating sheet 140.

The anode terminal 161 may include a side anode terminal portion 161s disposed on the first surface of the encapsulant part 150 and a lower anode terminal portion 161u disposed on the lower surface of the insulating sheet 140. The cathode terminal 162 may include a side cathode terminal portion 162s disposed on the second surface of the encapsulant part 150 and a lower cathode terminal portion 162u disposed on the lower surface of the insulating sheet 140.

According to an exemplary embodiment, the anode terminal 161 may include a lower base layer 161a, side base layers 161b and 161c connected to the lower base layer 161a, and plating layers 161d and 161e disposed to enclose the lower base layer 161a and the side base layers 161b and 161c.

In addition, the cathode terminal 162 may include a lower base layer 162a, side base layers 162b and 162c connected to the lower base layer 162a, and plating layers 162d and 162e disposed to enclose the lower base layer 162a and the side base layers 162b and 162c.

FIG. 4 illustrates a case in which a single lower base layer 161a and a single lower base layer 162a are provided, and two side base layers 161b and 161c and two side base layers 162b and 162c are provided, but the present inventive concept is not limited thereto. The lower base layer and side base layers may be disposed in various manners.

The anode terminal 161 and the cathode terminal 162 may be configured by performing dry-deposition (sputtering) or plating on one or more of Cr, Ti, Cu, Ni, Pd, and Au, or a process of forming and etching a metal layer, but are not limited thereto.

In addition, the anode terminal 161 and the cathode terminal 162 may be configured by a method of forming the lower base layers 161a and 162a, and then forming the side base layers 161b, 161c, 162b, and 162c to be connected to the lower base layers 161a and 162a.

The lower base layers 161a and 162a may be formed by an etching method, but are not limited thereto.

The lower base layers 161a and 162a may be disposed on the lower surface of the insulating sheet 140. After applying a thin metal layer onto the lower surface of the insulating sheet 140, an etching process may be performed thereon to form patterns in order to form the lower base layers 161a and 162a.

The lower base layers 161a and 162a are not particularly limited, but may contain, for example, copper (Cu).

In a case in which the lower base layers 161a and 162a are formed using copper (Cu), connectivity thereof with the side base layers 161b, 161c, 162b, and 162c formed through a separate process may be excellent, and electrical conductivity may be high.

The side base layers 161b, 161c, 162b, and 162c may be formed by a deposition method, such as a sputtering method.

The side base layers 161b, 161c, 162b, and 162c are not particularly limited, and may be configured as two inner layers and two outer layers.

The inner side base layers 161b and 162b among the side base layers 161b, 161c, 162b, and 162c may contain one or more of Cr or Ti, may be formed by a sputtering method, and may be connected to the lower base layers 161a and 162a.

The outer side base layers 161c and 162c among the side base layers 161b, 161c, 162b, and 162c may contain Cu, and may be formed by a sputtering method.

Figure 5:
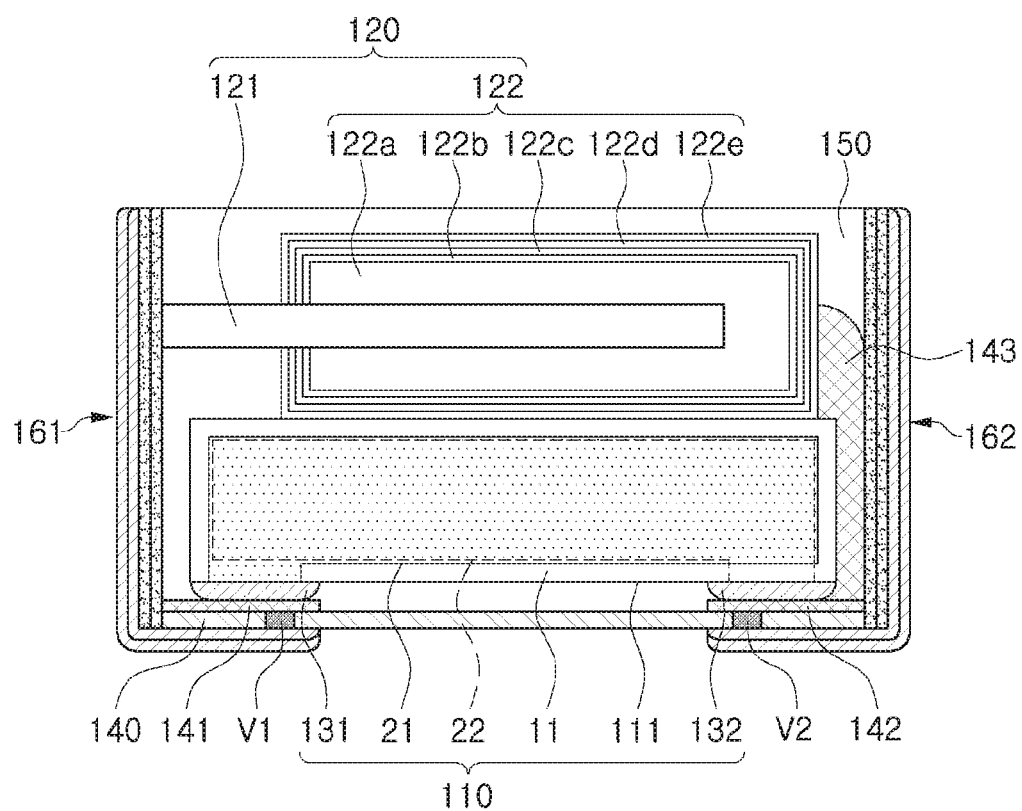
FIG. 5 is a cross-sectional view of a composite electronic component according to an example modified from an exemplary embodiment.

FIG. 5 is a cross-sectional view of a composite electronic component according to an example modified from an exemplary embodiment.

According to the modified example, the composite electronic component may further include conductive vias V1 and V2 penetrating through the insulating sheet 140, from the composite electronic component according to an exemplary embodiment.

The conductive vias may include a first conductive via V1 and a second conductive via V2. The first conductive via V1 may penetrate through the insulating sheet 140 and may be formed to correspond to a region in which the first external electrode 131 of the multilayer ceramic capacitor is disposed, and the second conductive via V2 may penetrate through the insulating sheet 140 and may be formed to correspond to a region in which the second external electrode 132 of the multilayer ceramic capacitor is disposed.

In a case in which the composite electronic component further includes the conductive vias V1 and V2 penetrating through the insulating sheet 140, a current applied through the anode terminal 161 and the cathode terminal 162 may penetrate through the insulating sheet 140, and may be transferred to the multilayer ceramic capacitor 110 disposed within the composite electronic component, whereby a size of a current loop may be further decreased, and consequently, ESL of the composite electronic component may be further decreased.

According to an exemplary embodiment of the present inventive concept, the tantalum capacitor and the multilayer ceramic capacitor may be connected in parallel with each other on the insulating sheet 140 used in the formation of the anode terminal and the cathode terminal of a frameless tantalum capacitor having no internal lead frame.

According to an exemplary embodiment, a composite electronic component in which impedance of the tantalum capacitor is exhibited in a low frequency range while impedance of the multilayer ceramic capacitor is exhibited in a high frequency range may be provided.

In addition, a composite electronic component having high capacitance while having low ESL may be provided.

Board Having Composite Electronic Component

Figure 6:
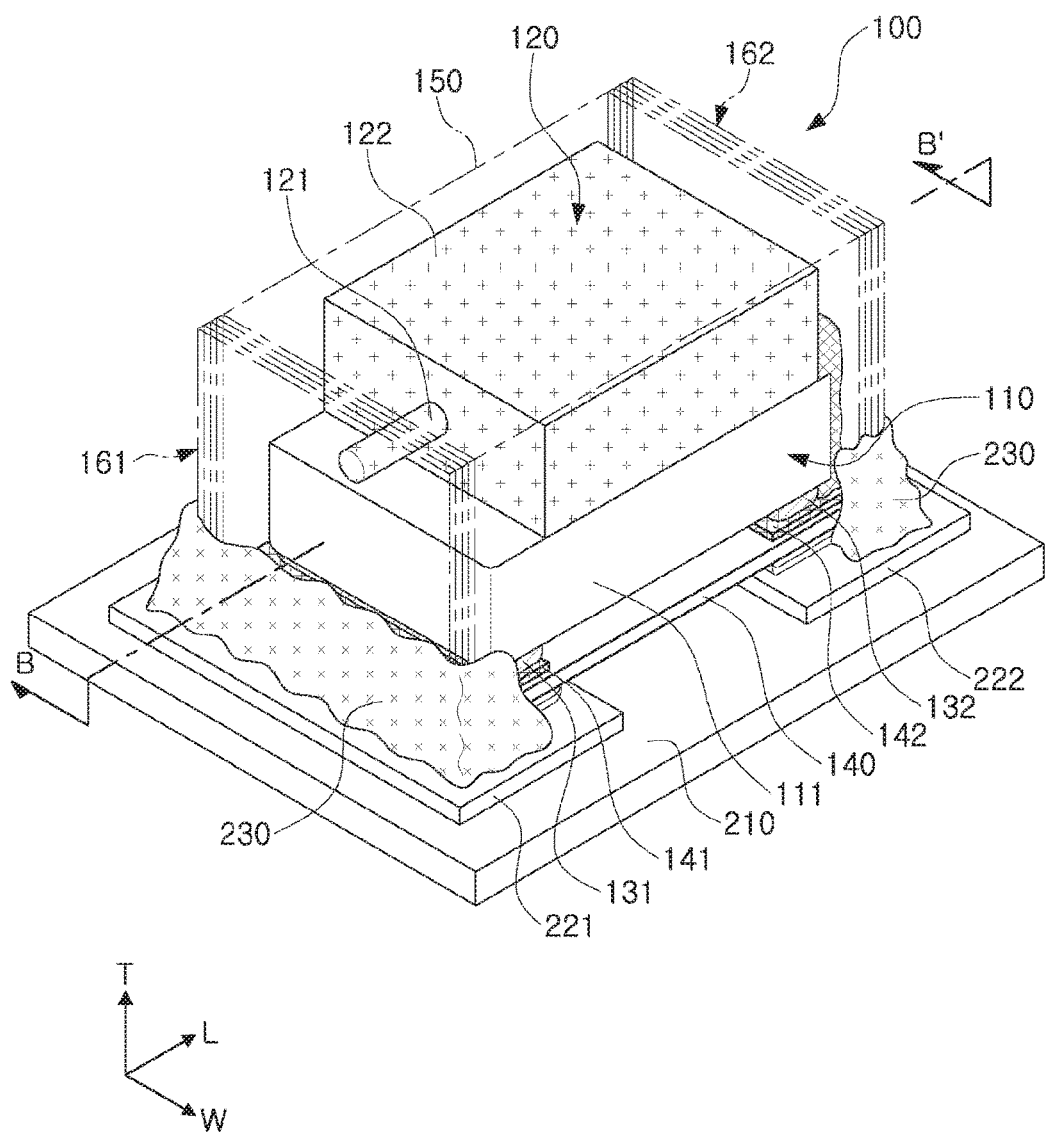
FIG. 6 is a perspective view illustrating a board in which a composite electronic component according to an exemplary embodiment is mounted on a printed circuit board.
Figure 7:
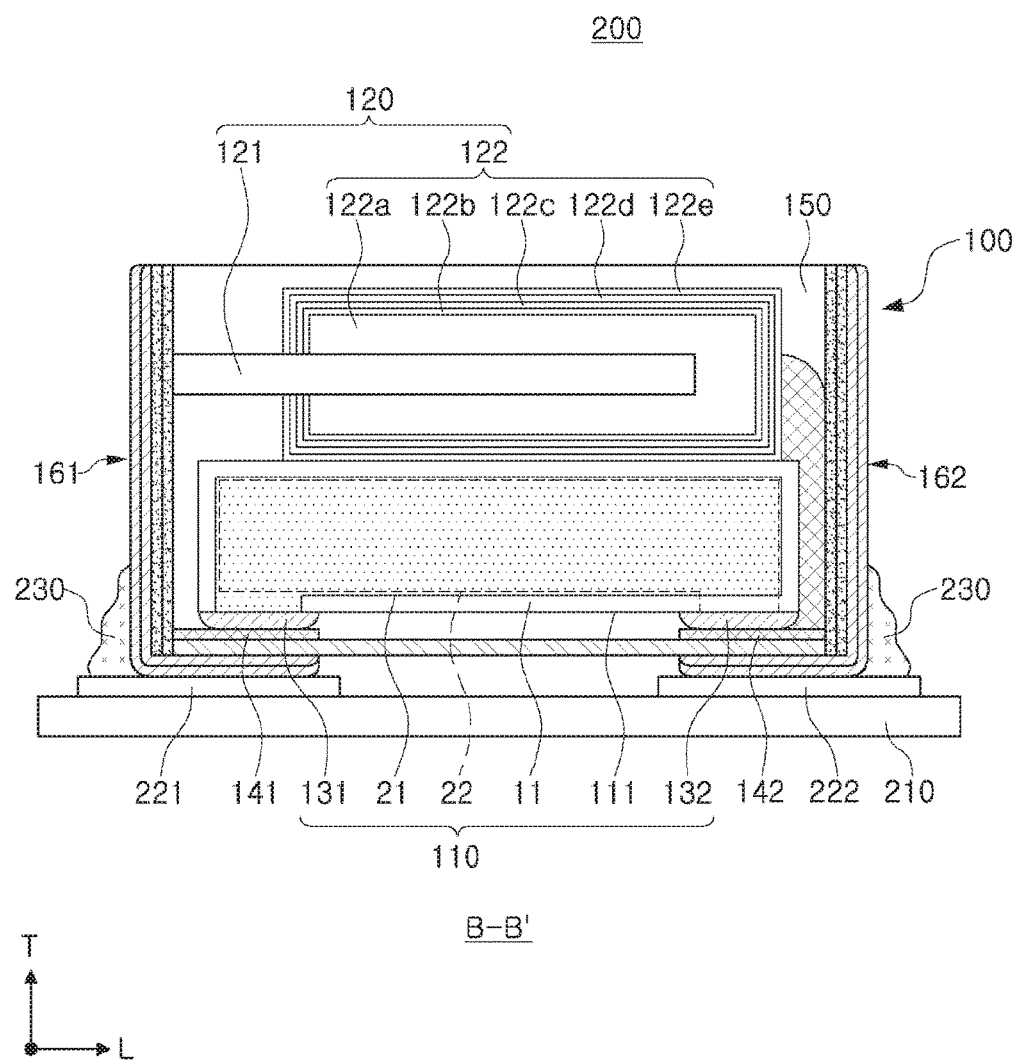
FIG. 7 is a cross-sectional view of FIG. 6, taken along line B-B'.

FIG. 6 is a perspective view illustrating a board in which a composite electronic component according to an exemplary embodiment of the present inventive concept is mounted on a printed circuit board. FIG. 7 is a cross-sectional view of FIG. 6, taken along line B-B'.

Referring to FIG. 6 and FIG. 7, a board 200 having the composite electronic component may include a printed circuit board 210 having electrode pads 221 and 222 formed thereon, the composite electronic component 100 mounted on the printed circuit board 210, and soldering portions 230 connecting the electrode pads 221 and 222 and the composite electronic component 100.

The board 200 having the composite electronic component according to the exemplary embodiment may include the printed circuit board 210 on which the composite electronic component 100 is mounted, and two or more electrode pads 221 and 222 formed on an upper surface of the printed circuit board 210.

The electrode pads 221 and 222 may include first and second electrode pads 221 and 222 connected to the anode terminal 161 and the cathode terminal 162 of the composite electronic component 100, respectively.

In this case, the anode terminal 161 and the cathode terminal 162 of the composite electronic component 100 may be electrically connected to the printed circuit board 210 by the soldering portions 230 in a state in which they are positioned on the first and second electrode pads 221 and 222 to come into contact therewith.

As set forth above, according to an exemplary embodiment, a composite electronic component having improved DC-bias properties and high capacitance, while allowing for the implementation of low levels of equivalent series resistance (ESR) and equivalent series inductance (ESL), may be provided.

In addition, according to an exemplary embodiment, a composite electronic component having excellent effects of reducing acoustic noise may be provided.

While exemplary embodiments have been shown and described above, it will be apparent to those skilled in the art that modifications and variations could be made without departing from the scope of the invention as defined by the appended claims.

What is claimed is:

1. A composite electronic component comprising:
   a multilayer ceramic capacitor including a ceramic body in which dielectric layers and internal electrodes are alternately disposed, and first and second external electrodes disposed on a lower surface of the ceramic body;
   a tantalum capacitor including a body portion containing a sintered material of a tantalum powder and a tantalum wire having a portion embedded in the body portion, and disposed on an upper surface of the multilayer ceramic capacitor; and
   an encapsulant part enclosing the tantalum capacitor and the multilayer ceramic capacitor, wherein the internal electrodes are led to the lower surface of the ceramic body, wherein a current loop formed in the multilayer ceramic capacitor and the tantalum capacitor is perpendicular to a mounting surface of the composite electronic component, and wherein the multilayer ceramic capacitor is disposed between the mounting surface of the composite electronic component and a lower surface of the tantalum capacitor.

2. The composite electronic component of claim 1, wherein the tantalum capacitor is in contact with the multilayer ceramic capacitor.

3. The composite electronic component of claim 1, further comprising: an insulating sheet disposed below the multilayer ceramic capacitor and the tantalum capacitor.

4. The composite electronic component of claim 3, further comprising: a conductive via penetrating through the insulating sheet.

5. The composite electronic component of claim 3, further comprising: a connection conductor portion disposed on an upper surface of the insulating sheet.

6. The composite electronic component of claim 5, wherein the connection conductor portion includes a metal pad.

7. The composite electronic component of claim 5, wherein the connection conductor portion contains a conductive resin.

8. The composite electronic component of claim 1, wherein the internal electrodes include lead portions led to the lower surface of the ceramic body.

9. The composite electronic component of claim 8, wherein the lower surface of the tantalum capacitor is in direct contact with the upper surface of the multilayer ceramic capacitor.

10. The composite electronic component of claim 1, further comprising: an anode terminal disposed on a first surface of the encapsulant part in a length direction and a lower surface of an insulating sheet; and a cathode terminal disposed on a second surface of the encapsulant part in the length direction and the lower surface of the insulating sheet.

11. The composite electronic component of claim 10, wherein the tantalum wire of the tantalum capacitor and the first external electrode of the multilayer ceramic capacitor are connected to the anode terminal.

12. The composite electronic component of claim 10, wherein the body portion of the tantalum capacitor and the second external electrode of the multilayer ceramic capacitor are connected to the cathode terminal.

13. The composite electronic component of claim 10, wherein the anode terminal and the cathode terminal include lower base layers, side base layers connected to the lower base layers, and plating layers enclosing the lower base layers and the side base layers.

14. The composite electronic component of claim 13, wherein the lower base layers are etched base layers.

15. The composite electronic component of claim 13, wherein the side base layers are deposited layers.

16. The composite electronic component of claim 13, wherein the lower base layers contain copper (Cu).

17. The composite electronic component of claim 13, wherein the side base layers contain one or more of chromium (Cr) and titanium (Ti).

18. The composite electronic component of claim 13, wherein the plating layers contain copper (Cu).

19. A board having a composite electronic component comprising:
a printed circuit board having electrode pads formed thereon;
the composite electronic component mounted on the printed circuit board, and
soldering portions connecting the electrode pads and the composite electronic component,
wherein the composite electronic component includes:
a multilayer ceramic capacitor including a ceramic body in which dielectric layers and internal electrodes are alternately disposed, and first and second external electrodes disposed on a lower surface of the ceramic body;
a tantalum capacitor including a body portion containing a sintered material of a tantalum powder and a tantalum wire having a portion embedded in the body portion, and disposed on an upper surface of the multilayer ceramic capacitor; and
an encapsulant part enclosing the tantalum capacitor and the multilayer ceramic capacitor,
the internal electrodes being led to the lower surface of the ceramic body,
wherein a current loop formed in the multilayer ceramic capacitor and the tantalum capacitor is perpendicular to a mounting surface of the composite electronic component, and
wherein the multilayer ceramic capacitor is disposed between the mounting surface of the composite electronic component and a lower surface of the tantalum capacitor.

* * * * *